United States Patent
Li

(10) Patent No.: US 9,685,433 B2
(45) Date of Patent: Jun. 20, 2017

(54) CAPACITOR DEVICE

(71) Applicant: TAIWAN SEMICONDUCTOR MANUFACTURING COMPANY LTD., Hsinchu (TW)

(72) Inventor: Chao-Chieh Li, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/495,368

(22) Filed: Sep. 24, 2014

(65) Prior Publication Data

US 2015/0084107 A1    Mar. 26, 2015

Related U.S. Application Data

(60) Provisional application No. 61/882,414, filed on Sep. 25, 2013.

(51) Int. Cl.
| | |
|---|---|
| *H01L 27/06* | (2006.01) |
| *H01L 49/02* | (2006.01) |
| *H01L 23/522* | (2006.01) |
| *H01L 27/08* | (2006.01) |
| *H01L 29/93* | (2006.01) |
| *H01L 29/94* | (2006.01) |

(52) U.S. Cl.
CPC ...... *H01L 27/0629* (2013.01); *H01L 23/5223* (2013.01); *H01L 27/0805* (2013.01); *H01L 28/86* (2013.01); *H01L 29/93* (2013.01); *H01L 29/94* (2013.01); *H01L 2924/0002* (2013.01)

(58) Field of Classification Search
CPC ..... H01L 27/0629; H01L 29/94; H01L 29/93; H01L 27/0805; H01L 23/5223; H01L 28/86
See application file for complete search history.

(56) References Cited

U.S. PATENT DOCUMENTS

| | | | | |
|---|---|---|---|---|
| 5,583,359 | A * | 12/1996 | Ng | H01L 23/5223 257/306 |
| 7,009,832 | B1 * | 3/2006 | Chen | H01G 4/228 257/306 |
| 7,335,956 | B2 | 2/2008 | Chen et al. | |
| 7,545,022 | B2 | 6/2009 | Chen et al. | |

(Continued)

*Primary Examiner* — Marc Armand
*Assistant Examiner* — Sue Tang
(74) *Attorney, Agent, or Firm* — WPAT, P.C., Intellectual Property Attorneys; Anthony King

(57) ABSTRACT

In some embodiments, a capacitor device includes a metal-oxide-metal (MOM) capacitor array and a varactor array configured overlapping with the MOM capacitor array. The MOM capacitor array includes a first MOM capacitor unit. The first MOM capacitor unit includes a first electrode pattern and a second electrode pattern in a first metallization layer. The first electrode pattern includes a plurality of first fingers and a first bus interconnecting the plurality of first fingers. The second electrode pattern includes a plurality of second fingers and a second bus interconnecting the plurality of second fingers. The varactor array includes a first varactor unit. The first varactor unit includes a first electrode contacting region and a second electrode contacting region. The first electrode pattern contacts the first electrode contacting region. The second electrode pattern contacts the second electrode contacting region.

16 Claims, 7 Drawing Sheets

(56) References Cited

U.S. PATENT DOCUMENTS

| | | | |
|---|---|---|---|
| 2007/0296013 A1* | 12/2007 | Chang | H01L 23/5223 257/306 |
| 2008/0157889 A1* | 7/2008 | Yu | H03B 5/04 331/1 R |
| 2014/0225225 A1* | 8/2014 | Chung | H01L 28/40 257/532 |

* cited by examiner

CAPACITOR DEVICE

PRIORITY CLAIM AND CROSS-REFERENCE

This application claims the benefit of provisional application Ser. 61/882,414 filed on Sep. 25, 2013, entitled "CAPACITOR DEVICE", the disclosure of which is hereby incorporated by reference in its entirety.

TECHNICAL FIELD

The present disclosure is related to a capacitor device.

BACKGROUND

Capacitors have a variety of applications in integrated circuits. For example, in mixed-signal circuits, capacitors are used in phase locked loops (PLLs) and in radio-frequency (RF) circuits, capacitors are used in an RF resonator. For another example, decoupling capacitors are used to decouple portions of the integrated circuits from one another to reduce the impact of noise from some portions to other portions.

In various situations, a capacitor array occupies a large percentage of area of the circuit, including, for example, 50% of the total area of a PLL. A large capacitor array not only causes a chip area to increase, but also worsens other problems such as IR drop and electromigration (EM) reliability due to more and longer wires coupled to power lines. These problems, for example, cause higher instability in a supplied voltage, and affect performance and functions of the chip. Therefore, optimizing area efficiency of capacitors, capacitance per unit area, is applicable for various reasons.

In some approaches, a metal-oxide-semiconductor (MOS) capacitor and a metal-oxide-metal (MOM) capacitor are vertically arranged on the same layout area to increase capacitance per unit area. The MOS capacitor is built based on capacitance inherent to an active element such as an NMOS and a PMOS. The MOM capacitor is constructed by two electrodes with stacked layers of comb-like structures separated by dielectrics. When the MOS capacitor and the MOM capacitor are vertically arranged on the same layout area, a shielding layer is inserted therebetween to separate capacitance of the MOS capacitor from that of the MOM capacitor. However, such shielding layer uses one extra layer and therefore occupies one metallization layer that the MOM capacitor can use to contribute to capacitance per unit area.

In some approaches, a plurality of MOM capacitor units is connected to form a capacitor array. To connect two electrodes of two corresponding MOM capacitor units, an additional metallization layer is used. However, the additional metallization layer results in a lower capacitance per unit area.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
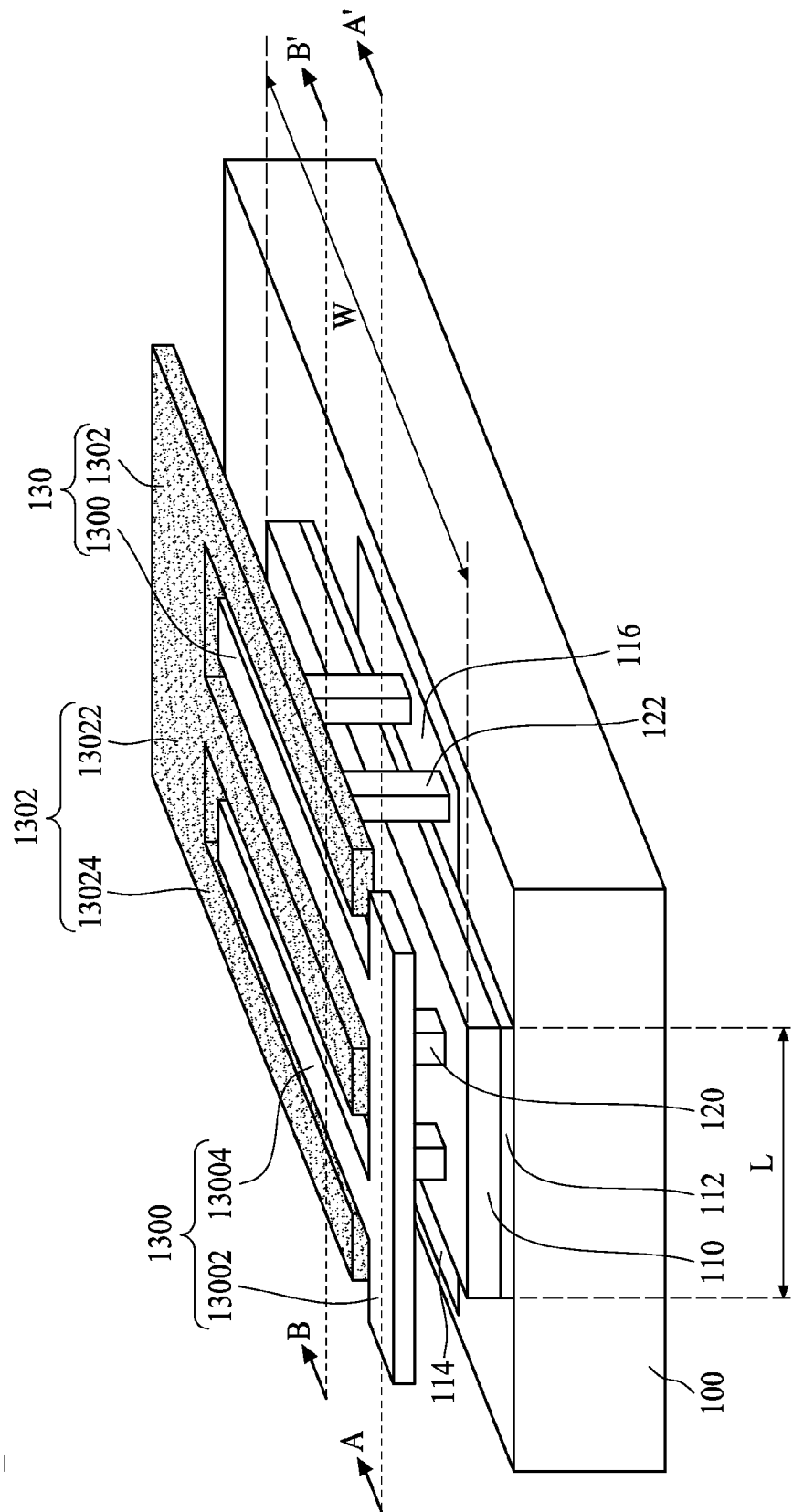
FIG. 1 is a schematic perspective diagram of a varactor unit with integrated electrode patterns of a MOM capacitor unit in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled to" another element, it may be directly connected to or coupled to the other element, or intervening elements may be present.

Some embodiments have one or a combination of the following features and/or advantages. In some embodiments, in a capacitor array, a varactor unit combined with a MOM capacitor unit shares a metallization layer with the MOM capacitor unit. In the shared metallization layer, terminals for contacting electrode contacting regions of the varactor unit are adapted into shapes of electrode patterns in the metallization layer of the MOM capacitor unit. Therefore, compared with some other approaches, a metallization layer is saved and capacitance per unit area is increased. In some embodiments, a MOM capacitor unit and a neighboring MOM capacitor unit are combined in a back-to-back manner. The neighboring MOM capacitor unit is a symmetrical structure of the MOM capacitor unit and is therefore directly coupled to the MOM capacitor unit using the metallization layers from which electrode patterns are made. Hence, a metallization layer for connecting the MOM capacitor units is saved and the capacitance per unit area is increased. Additionally, because a metallization layer is saved, the IR drops and/or EM reliabilities are improved. In some embodiments, vias for connecting electrode patterns in different metallization layers are concentrated in fingers that are the first and/or last fingers in finger arrangements on buses, thereby decreasing spacing between other fingers in the finger arrangements on the buses.

Varactor Unit with Integrated Electrode Patterns of MOM Capacitor Unit

FIG. 1 is a schematic perspective diagram of a varactor unit 1 with integrated electrode patterns of a MOM capacitor unit in accordance with some embodiments. In FIG. 1, the varactor unit 1 is a MOS capacitor unit, which includes a substrate 100, a gate region 110, a dielectric layer 112, and source or drain regions 114 and 116. The varactor unit 1 also includes terminals that are adapted into shapes of an electrode pattern 1300 and an electrode pattern 1302 in a metallization layer 130 of a MOM capacitor unit, respectively. The varactor unit 1 also includes a plurality of vias 120 for the electrode pattern 1300 to contact the region 110, and a plurality of vias 122 for the electrode pattern 1302 to contact the regions 114 and 116. For simplicity, other layers of the MOM capacitor unit are not shown in FIG. 1.

The electrode pattern 1300 or 1302 includes a bus 13002 or 13022 interconnecting a plurality of fingers 13004 or 13024. The vias 120 are located between the region 110 and the bus 13002 of the electrode pattern 1300 for the electrode pattern 1300 to contact the region 110. The vias 122 are located between the regions 114 and 116, and two of the fingers 13024 of the electrode pattern 1302 for the electrode pattern 1302 to contact the regions 114 and 116. Further, in FIG. 1, only one of the vias 120 or 122 shown is labeled and one of the fingers 13004 or 13024 of the electrode 1300 or 1302 shown is labeled. Similarly, in FIGS. 2-5, only one of the vias and one of the fingers shown are labeled.

In the embodiments in FIG. 1, the varactor unit 1 uses the electrode patterns 1300 and 1302 of the metallization layer 130 of the MOM capacitor unit directly as terminals for the corresponding region 110 and the regions 114 and 116. Because the terminals of the varactor unit 1 are adapted into shapes of the electrode patterns 1300 and 1302 of the metallization layer 130 of the MOM capacitor unit, the shielding layer in some other approaches is saved. In addition, the metallization layer for constructing the terminals of the MOS capacitor unit and the metallization layer for constructing one of the stacked layers of the electrode patterns of the MOM capacitor unit are shared in the embodiments in FIG. 1, but are separated in some other approaches. The saved layers can be used to form a MOM capacitor unit with more stacked layers of electrode patterns. The additional stacked layers of the electrode patterns effectively form capacitors in parallel with the capacitors formed by the original stacked layers of the electrode patterns. As a result, the total capacitance of the area over which the electrode patterns are stacked and the capacitance per unit area are each increased.

Figure 2:
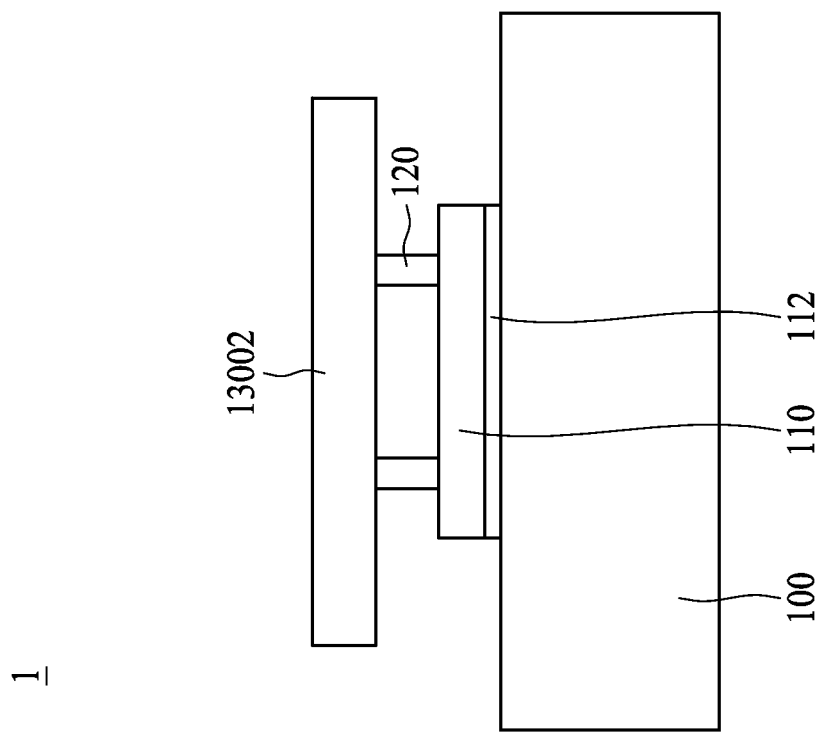
FIG. 2 is a schematic cross-sectional diagram along line AA' of the varactor unit in FIG. 1 in accordance with some embodiments.

FIG. 2 is a schematic cross-sectional diagram along line AA' of the varactor unit 1 in FIG. 1 in accordance with some embodiments. As can be seen from FIG. 2, the region 110 and the dielectric layer 112 are stacked on the substrate 100. The region 110 serves as a first electrode contact region of the varactor unit 1. The bus 13002 of the electrode pattern 1300 in FIG. 1 overlaps with the region 110 and contacts the region 110 through the vias 120.

Figure 3:
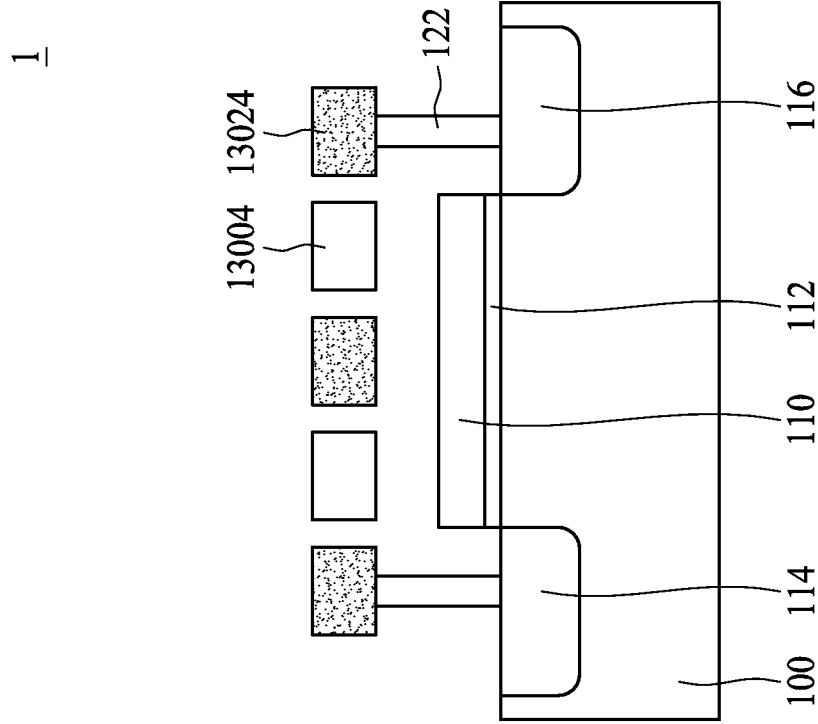
FIG. 3 is a schematic cross-sectional diagram along line BB' of the varactor unit in FIG. 1 in accordance with some embodiments.

FIG. 3 is a schematic cross-sectional diagram along line BB' of the varactor unit 1 in FIG. 1 in accordance with some embodiments. As can be seen from FIG. 3, the regions 114 and 116 are formed beside the region 110 and the dielectric layer 112. The regions 114 and 116 serve as a second electrode contact region of the varactor unit 1. The fingers 13024 of the electrode pattern 1302 overlap with the regions 114 and 116 and contact the regions 114 and 116 through the vias 122. In some embodiments, the varactor unit 1 has the same structure as a standard NMOS with the regions 114 and 116 coupled to the fingers 13024 of the electrode pattern 1302 in FIG. 1 and thereby shorted together. In other embodiments, a varactor unit (not shown) has the same structure as a standard PMOS with the regions 114 and 116 coupled to the fingers 13024 of the electrode pattern 1302. In other embodiments, a varactor unit (not shown) has a structure based on the standard NMOS or PMOS, for example, an inversion-mode MOS varactor or an accumulation-mode MOS varactor. The fingers 13004 of the electrode pattern 1300 which are coupled to the bus 13002 shown in FIG. 1 are coupled to the region 110 through the bus 13002 of the electrode pattern 1300 as illustratively shown in FIG. 2.

In FIG. 1, the varactor unit 1 is implemented as the MOS varactor unit. Further, the region 110, and the regions 114 and 116 are the corresponding first and second electrode contacting regions upon which the terminals of the MOS varactor unit are configured. Other implementations of the varactor unit 1 such as a P-N junction varactor that includes first and second electrode contacting regions of different conductive types are also within the contemplated scope of the present disclosure. In addition, although the term "varactor" is used, the present disclosure is not limited to capacitor units with variable capacitance but is also applicable to capacitor units with fixed capacitance.

Connected MOM Capacitor Units

Figure 4:
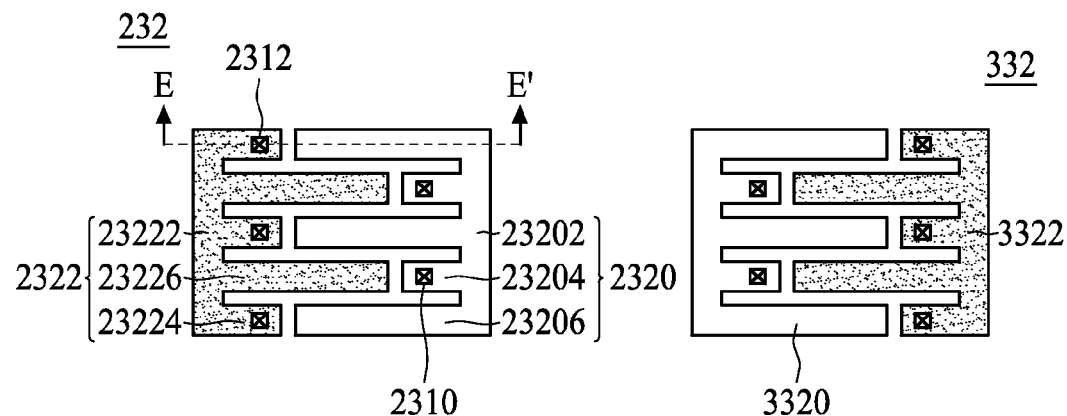
FIG. 4 includes a schematic cross-sectional diagram, and schematic top-view diagrams of a first MOM capacitor unit and a second MOM capacitor unit in accordance with some embodiments.
Figure 4:
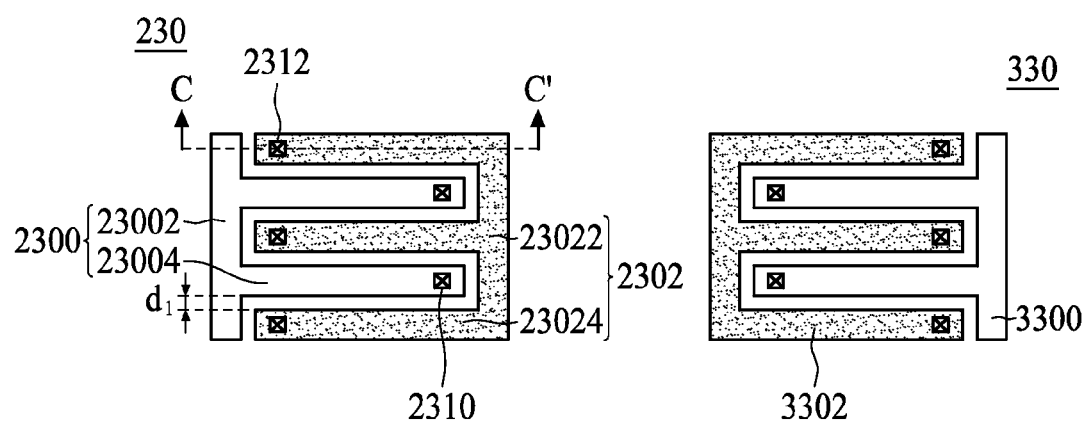
Figure 4:
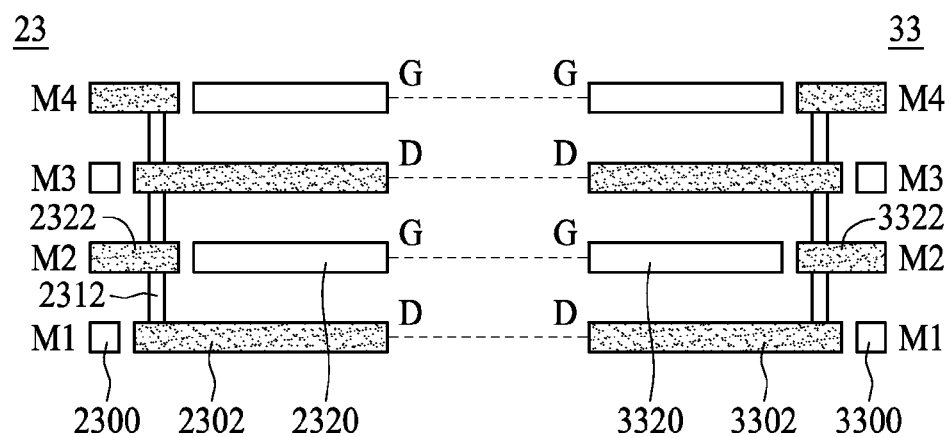

FIG. 4 shows stacked layers of a MOM capacitor unit and a manner with which two MOM capacitor units are connected in accordance with some embodiments. FIG. 4 includes a schematic cross-sectional diagram 23 of a first MOM capacitor unit, and schematic top-view diagrams 230 and 232 of some metallization layers of the first MOM capacitor unit; and a schematic cross-sectional diagram 33 of a second MOM capacitor unit, and schematic top-view diagrams 330 and 332 of some metallization layers of the second MOM capacitor unit. In the cross-sectional diagram 23, the first MOM capacitor unit includes a plurality of metallization layers, including exemplary layers M1, M2, M3 and M4. The metallization layer M1 includes electrode patterns 2300 and 2302 which are illustratively shown in the top-view diagram 230. The metallization layer M2 includes electrode patterns 2320 and 2322 which are illustratively shown in the top-view diagram 232. The metallization layers M3 and M4 are the same as the metallization layers M1 and M2, respectively. The first MOM capacitor unit also includes vias 2312 and vias 2310. The vias 2310 are shown in the top-view diagrams 230 and 232 but not in the cross-sectional diagram 23. The vias 2312 connect the electrode patterns 2302 and 2322 of the corresponding metallization layers M1 and M2, the electrode patterns 2322 and 2302 of the corresponding metallization layers M2 and M3, and the electrode patterns 2302 and 2322 of the corresponding metallization layers M3 and M4. The vias 2310 connect the electrode patterns 2300 and 2320 of the corresponding metallization layers M1 and M2, the electrode patterns 2320 and 2300 of the corresponding metallization layers M2 and M3 and the electrode patterns 2300 and 2320 of the corresponding metallization layers M3 and M4.

In some embodiments, the electrode patterns 2300 and 2302 in the metallization layer M1 are coupled to the region 110, and the regions 114 and 116 of a first varactor unit as illustratively shown as the varactor unit 1 in FIG. 1, respectively. Therefore, the connected electrode patterns 2300 and 2320 in the metallization layers M1 to M4 are coupled to the region 110 of the first varactor unit, denoted by G beside the electrode patterns 2320 in the cross-sectional diagram 23. The connected electrode patterns 2302 and 2322 in the metallization layers M1 to M4 are coupled to the regions 114 and 116 of the first varactor unit, denoted by D beside the electrode patterns 2302 in the cross-sectional diagram 23.

In the cross-sectional diagram 23, the electrode patterns 2302, 2322 in the corresponding metallization layers M1 to M4 are stacked in a staggered manner. For example, the electrode patterns in any two adjacent metallization layers overlap in a portion, and the non-overlapped portions extend along opposite sides of the overlapped portions. The staggered manner is described in further detail below using the metallization layers M1 and M2 as an example. Similarly but not shown, the electrode patterns 2300 and 2320 in the corresponding metallization layers M1 to M4 are stacked in a staggered manner. Therefore, capacitance is formed between the corresponding electrode patterns 2300 and 2302 in the same metallization layer M1 or M3 and between the corresponding electrode patterns 2320 and 2322 in the same metallization layer M2 or M4. Capacitance is also formed between the corresponding electrode patterns 2300 and 2322 and between the corresponding electrode patterns 2302 and 2320 across different metallization layers M1 and M2, M3 and M2, and M3 and M4.

The metallization layers M1 and M2 in the cross-sectional diagram 23 are cross-sectional views along lines CC' and EE' in the top-view diagrams 230 and 232 of the metallization layers M1 and M2, respectively. In the top-view diagram 230, the electrode pattern 2302 includes a plurality of fingers 23024 of substantially equal length and a bus 23022 interconnecting the fingers 23024. Complementary to the electrode pattern 2302, the electrode pattern 2300 includes a plurality of fingers 23004 of substantially equal length and a bus 23002 interconnecting the fingers 23004. In the top-view diagram 232, the electrode pattern 2322 includes a plurality of shorter fingers 23224, a plurality of longer fingers 23226 interleaving with the shorter fingers 23224, and a bus 23222 interconnecting the fingers 23224 and 23226. Complementary to the electrode pattern 2322, the electrode pattern 2320 includes a plurality of longer fingers 23206, a plurality of shorter fingers 23204 interleaving with the longer fingers 23206 and a bus 23202 interconnecting the fingers 23204 and 23206. The shorter fingers 23224 in the top-view diagram 232 overlap with the fingers 23024 in the top-view diagram 230 such that at least one via 2312 is disposed between each overlapped pair of the shorter fingers 23224 and the fingers 23024, thereby connecting the electrode patterns 2322 and 2302 in the metallization layers M2 and M1. The bus 23222 in the top-view diagram 232 overlaps with the bus 23002 in the top-view diagram 230, and the longer fingers 23226 in the top-view diagram 232 overlaps with the fingers 23004 in the top-view diagram 230 so that the capacitance across the metallization layers M1 and M2 are formed. Similarly, the shorter fingers 23204 in the top-view diagram 232 overlap with the fingers 23004 in the top-view diagram 230 such that at least one via 2310 is disposed between each overlapped pair of the shorter fingers 23204 and the fingers 23004, thereby connecting the electrode patterns 2320 and 2300 in the metallization layers M2 and M1. The bus 23202 in the top-view diagram 232 overlaps with the bus 23022 in the top-view diagram 230, and the longer fingers 23206 in the top-view diagram 232 overlap with the fingers 23024 in the top-view diagram 230 so that the capacitance across metallization layers M1 and M2 are formed.

In the embodiments illustratively shown in FIG. 4, at least one via 2310 or 2312 is disposed on each finger 23004 or 23024 in the top-view diagram 230, or on each shorter finger 23204 or 23224 in the top-view diagram 232. Therefore, a spacing $d_1$ between the adjacent fingers 23004 and 23024 in the top-view diagram 230 is larger than the minimum metal-to-metal spacing due to the vias 2310 and 2312 disposed on the adjacent fingers. The shorter fingers 23204 and 23224 in the top-view diagram 232 overlap with the fingers 23004 and 23024, respectively, and also have the same spacing as the spacing $d_1$. The minimum metal-to-metal spacing is in accordance with a metal-to-metal spacing rule for design rule check (DRC).

The second MOM capacitor unit as illustratively shown in the cross-sectional diagram 33 and in top-view diagrams 330 and 332 is a symmetrical structure of the first MOM capacitor unit with respect to one of the buses of the electrode patterns. For example, the cross-sectional diagram 33 of the second MOM capacitor unit is a symmetrical diagram of the cross-sectional diagram 23 of the first MOM capacitor unit with respect to the bus 23002 or 23022 shown in the top-view diagram 230. The top-view diagram 330 is a symmetrical diagram of the top view diagram 230 with respect to the bus 23002 or 23022. The top-view diagram 332 is a symmetrical diagram of the top view diagram 232 with respect to the bus 23202 or 23222.

In some embodiments, the electrode patterns 3300 and 3302 in the metallization layer M1 are coupled to the region 110 and the regions 116 and 114 of a second varactor unit as illustratively shown as the varactor unit 1 in FIG. 1, respectively. Hence, connected electrode patterns 3300 and 3320 in the metallization layers M1 to M4 are coupled to the region 110 of the second varactor unit, denoted by G beside the electrode patterns 3320; and connected electrode patterns 3302 and 3322 in the metallization layers M1 to M4 are coupled to the regions 114 and 116 of the second varactor unit, denoted by D beside the electrode patterns 3302.

By creating a symmetrical structure of the first MOM capacitor unit with respect to one of the buses of the electrode patterns as the second MOM capacitor unit, in the metallization layer M1, the electrode pattern 2302 of the first MOM capacitor unit and the electrode pattern 3302 of the second MOM capacitor unit are coupled to each other directly using the metallization layer M1. In the metallization layer M2, the electrode pattern 2320 of the first MOM capacitor unit and the electrode pattern 3320 of the second MOM capacitor unit are coupled to each other directly using the metallization layer M2. Therefore, the first MOM capacitor unit and the second MOM capacitor unit are connected together without using an additional metallization layer for connection as in some other approaches, thereby saving a metallization layer for increasing capacitance per unit area.

Figure 5:
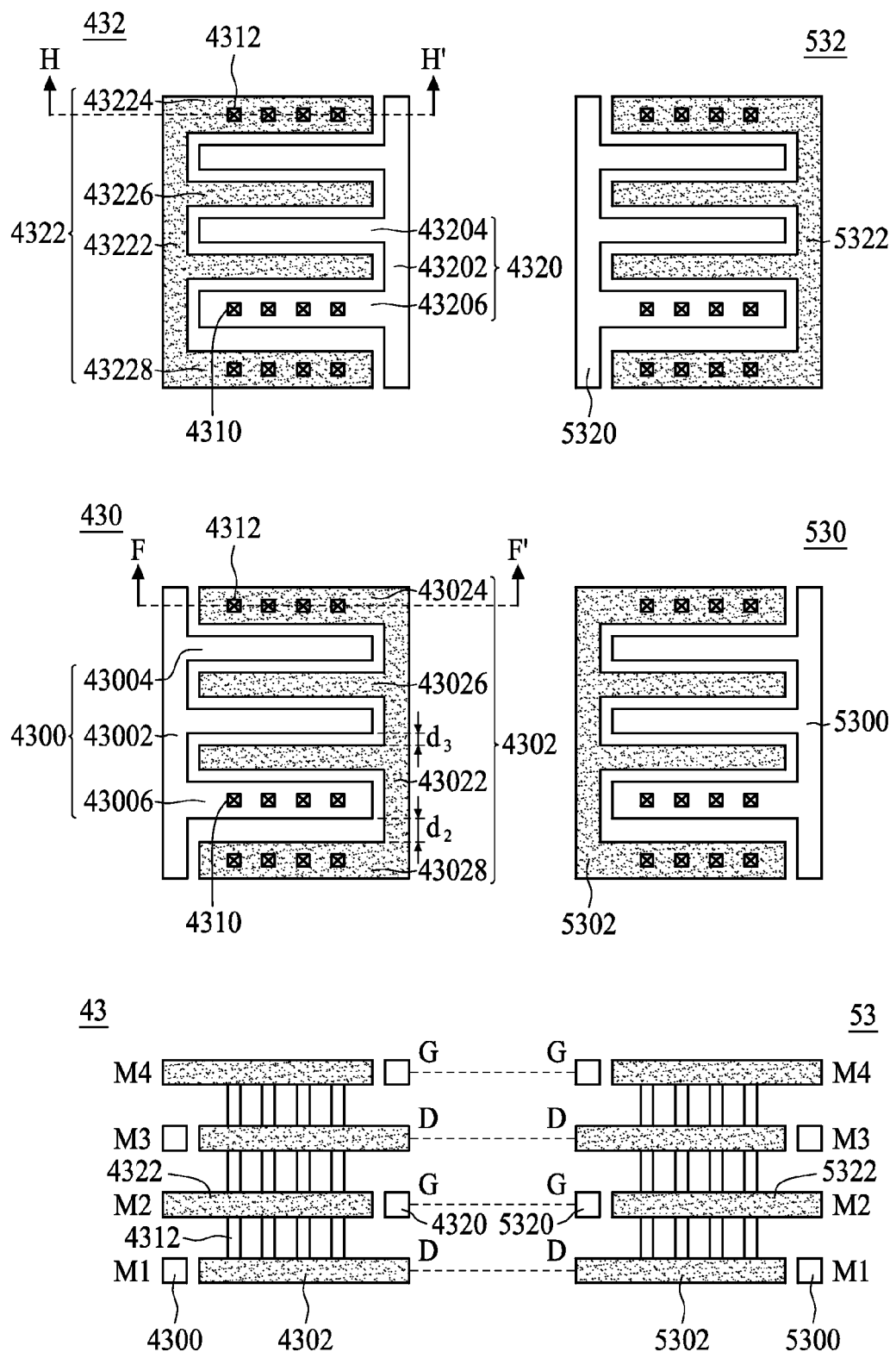
FIG. 5 includes a schematic cross-sectional diagram, and schematic top-view diagrams of a third MOM capacitor unit and a fourth MOM capacitor unit in accordance with some embodiments.

FIG. 5 shows stacked layers of a MOM capacitor unit and a manner with which two MOM capacitor units are connected, in accordance with some embodiments. FIG. 5 includes a schematic cross-sectional diagram 43 of a third MOM capacitor unit, and schematic top-view diagrams 430 and 432 of some metallization layers of the third MOM capacitor unit; and a schematic cross-sectional diagram 53 of a fourth MOM capacitor unit, and schematic top-view diagrams 530 and 532 of some metallization layers of the fourth MOM capacitor unit. The embodiments illustratively shown in FIG. 4 are different from the embodiments illustratively shown in FIG. 5 in that the vias 2310 and 2312 are distributed among each finger in FIG. 4 while the vias 4310 and 4312 are concentrated in some fingers in FIG. 5. In the cross-sectional diagram 43, the third MOM capacitor unit includes exemplary metallization layers M1, M2, M3 and M4. The metallization layer M1 includes electrode patterns 4300 and 4302 which are illustratively shown in the top-view diagram 430. The metallization layer M2 includes electrode patterns 4320 and 4322 which are illustratively shown in the top-view diagram 432. The metallization layers M3 and M4 are the same as the metallization layers M1 and M2, respectively. The third MOM capacitor unit also includes vias 4312 and vias 4310. The vias 4310 are shown in the top-view diagrams 430 and 432 but not in the cross-sectional diagram 43. The vias 4312 connect the electrode patterns 4302 and 4322 of the corresponding metallization layers M1 and M2, the electrode patterns 4322 and 4302 of the corresponding metallization layers M2 and M3, and the electrode patterns 4302 and 4322 of the corresponding metallization layers M3 and M4. The vias 4310 connect the electrode patterns 4300 and 4320 of the corresponding metallization layers M1 and M2, the electrode patterns 4320 and 4300 of the corresponding metallization layers M2 and M3 and the electrode patterns 4300 and 4320 of the corresponding metallization layers M3 and M4.

In some embodiments, the electrode patterns 4300 and 4302 in the metallization layer M1 are coupled to the region 110 and the regions 114 and 116 of the third varactor unit as illustratively shown as the varactor unit 1 in FIG. 1, respectively. Therefore, the connected electrode patterns 4300 and 4320 in the metallization layers M1 to M4 are coupled to the region 110 of the third varactor unit, denoted by G beside the electrode patterns 4320 in the cross-sectional diagram 43. The connected electrode patterns 4302 and 4322 in the metallization layers M1 to M4 are coupled to the regions 114 and 116 of the third varactor unit, denoted by D beside the electrode patterns 4302 in the cross-sectional diagram 43.

In the cross-sectional diagram 43, the electrode patterns 4302, 4322 in the corresponding metallization layers M1 to M4 are stacked in a staggered manner. Similarly but not shown, the electrode patterns 4300 and 4320 in the corresponding metallization layers M1 to M4 are stacked in a staggered manner. The staggered manner is described in further detail below using the metallization layers M1 and M2 as an example. Therefore, capacitance is formed between the corresponding electrode patterns 4300 and 4302 in the same metallization layer M1 or M3 or between corresponding electrode patterns 4320 and 4322 in the same metallization layer M2 or M4. Capacitance is also formed between the corresponding electrode patterns 4300 and 4322, and between the electrode patterns 4302 and 4320 across different metallization layers M1 and M2, M3 and M2, and M3 and M4.

The metallization layers M1 and M2 in the cross-sectional diagram 43 are cross-sectional views along lines FF' and HH' in the top-view diagrams 430 and 432 of the metallization layers M1 and M2, respectively. In the top-view diagram 430, the electrode pattern 4302 includes a plurality of thinner fingers 43026 and wider fingers 43024 and 43028 and a bus 43022 interconnecting the fingers 43024, 43026 and 43028. The thinner fingers 43026 have substantially the same length as the wider fingers 43024 and 43028. A plurality of vias 4312 is disposed on the wider fingers 43024 and 43028 but not on the thinner fingers 43026. Complementary to the electrode pattern 4302, the electrode pattern 4300 includes a plurality of thinner fingers 43004 and a wider finger 43006 and a bus 43002 interconnecting the fingers 43004 and 43006. The thinner fingers 43004 have substantially the same length as the wider finger 43006. A plurality of vias 4310 is disposed on the wider finger 43006 but not on the thinner fingers 43004.

The top-view diagram 432 is a symmetrical diagram of the top-view diagram 430 with respect to one of the buses 43002 and 43022. In the top-view diagram 432, the electrode pattern 4322 includes a plurality of thinner fingers 43226 and wider fingers 43224 and 43228 of substantially equal length, and a bus 43222 interconnecting the fingers 43224, 43226 and 43228. The vias 4312 are disposed on the wider fingers 43224 and 43228, but not on the thinner fingers 43226. Complementary to the electrode pattern 4322, the electrode pattern 4320 includes a plurality of thinner fingers 43204, a wider finger 43206 and a bus 43202 interconnecting the fingers 43204 and 43206. The vias 4310 are disposed on the wider finger 43206 but not on the thinner fingers 43204.

The wider fingers 43224 and 43228 in the top-view diagram 432 overlap with the wider fingers 43024 and 43028 in the top-view diagram 430, respectively, such that the vias 4312 are disposed between each overlapped pair of the wider fingers 43224 and 43024, and 43228 and 43028, thereby connecting the electrode patterns 4322 and 4302 in the metallization layers M2 and M1. The bus 43222 in the top-view diagram 432 overlaps with the bus 43002 in the top-view diagram 430, so that the capacitance across the metallization layers M2 and M1 are formed. Similarly, the wider fingers 43206 in the top-view diagram 432 overlaps with the wider finger 43006 in the top-view diagram 430 such that the vias 4310 are disposed between the overlapped pair of the wider fingers 43206 and 43006, thereby connecting the electrode patterns 4320 and 4300 in the metallization layers M2 and M1. The bus 43202 in the top-view diagram 432 overlaps with the bus 43022 in the top-view diagram 430, so that the capacitance across the metallization layers M2 and M1 are formed.

In the example illustratively shown in the top-view diagram 430, the vias 4310 and 4312 are not distributed among each finger 43004, 43006, 43024, 43026 or 43028 as in the embodiment illustrated in FIG. 4. The vias 4310 are concentrated in the wider finger 43006 which is the first or last finger in a finger arrangement on the bus 43002. Further, the vias 4312 are concentrated in the wider fingers 43024 and 43028 which are the first and the last fingers in a finger arrangement on the bus 43022. With respect to the buses 43002 and 43022, the wider fingers 43006 and 43024 are the corresponding first and last fingers in the finger arrangements. Further, the wider fingers 43006 and 43028 are either both the first fingers or both the last fingers in the finger arrangements. Therefore, in FIG. 4, the spacing $d_1$ between the adjacent fingers 23004 and 23024 in the top-view diagram 230, is the same for each adjacent pair of fingers, and is larger than the minimum metal-to-metal spacing, while in FIG. 5, a spacing $d_2$ between the wider fingers 43006 and 43028 is larger than a spacing $d_3$ between the thinner fingers 43004 and 43026, and a spacing similar to the spacing $d_3$ between the thinner finger 43004 or 43026 and the wider finger 43024 or 43006. The spacing $d_3$, in some embodiments, is equal to the minimum metal-to-metal spacing. The spacing configuration in the top-view diagram 432 is similar to that of the top-view diagram 430 and the description is therefore omitted.

The structure of the electrode patterns and the locations of the vias in FIG. 4 and FIG. 5 are used for illustration. Features of FIG. 4 and FIG. 5 may be mixed in alternative embodiments. Other structures of the electrode patterns and other locations of the vias for connecting different metallization layers stacked in a staggered manner are within the contemplated scope of the present disclosure.

In some embodiments with reference to the top-view diagram 430 in FIG. 5, when the third MOM capacitor unit is connected with the third varactor unit as illustratively shown in FIG. 1, the wider fingers 43024 and 43028 of the electrode pattern 4302 overlap the regions 114 and 116, respectively, and the vias 122 are disposed therebetween. Therefore, the vias 122 for connecting the third varactor unit and the third MOM capacitor unit, and the vias 4312 for connecting different metallization layers of the third MOM capacitor unit are concentrated in the two wider fingers 43024 and 43028.

The fourth MOM capacitor unit as illustratively shown in the cross-sectional diagram 53 and in top-view diagrams 530 and 532 is a symmetrical structure of the third MOM capacitor unit with respect to one of the buses of the electrode patterns. For example, the cross-sectional diagram 53 of the fourth MOM capacitor unit is a symmetrical diagram of the cross-sectional diagram 43 of the third MOM capacitor unit with respect to the bus 43002 or 43022 shown in the top-view diagram 430. The top-view diagram 530 is a symmetrical diagram of the top view diagram 430 with respect to the bus 43002 or 43022. The top-view diagram 532 is a symmetrical diagram of the top view diagram 432 with respect to the bus 43202 or 43222.

In some embodiments, electrode patterns 5300 and 5302 in the metallization layer M1 are coupled to the region 110 and the regions 116 and 114 of a fourth varactor unit as illustratively shown as the varactor unit 1 in FIG. 1, respectively. Hence, connected electrode patterns 5300 and 5320 in the metallization layers M1 to M4 are coupled to the region 110 of the fourth varactor unit, denoted by G beside the electrode patterns 5320; and connected electrode patterns 5302 and 5322 in the metallization layers M1 to M4 are coupled to the regions 114 and 116 of the fourth varactor unit, denoted by D beside the electrode patterns 5302.

By creating a symmetrical structure of the third MOM capacitor unit with respect to one of the buses of the electrode patterns to form the fourth MOM capacitor unit, in the metallization layer M1, the electrode pattern 4302 of the third MOM capacitor unit and the electrode pattern 5302 of the fourth MOM capacitor unit are coupled to each other directly using the metallization layer M1. In the metallization layer M2, the electrode pattern 4320 of the third MOM capacitor unit and the electrode pattern 5320 of the fourth MOM capacitor unit are coupled to each other directly using the metallization layer M2. Therefore, the third MOM capacitor unit and the fourth MOM capacitor unit are connected together without using an additional metallization layer for connection as in some other approaches, thereby saving a metallization layer for increasing capacitance per unit area.

Capacitor Array

Figure 6:
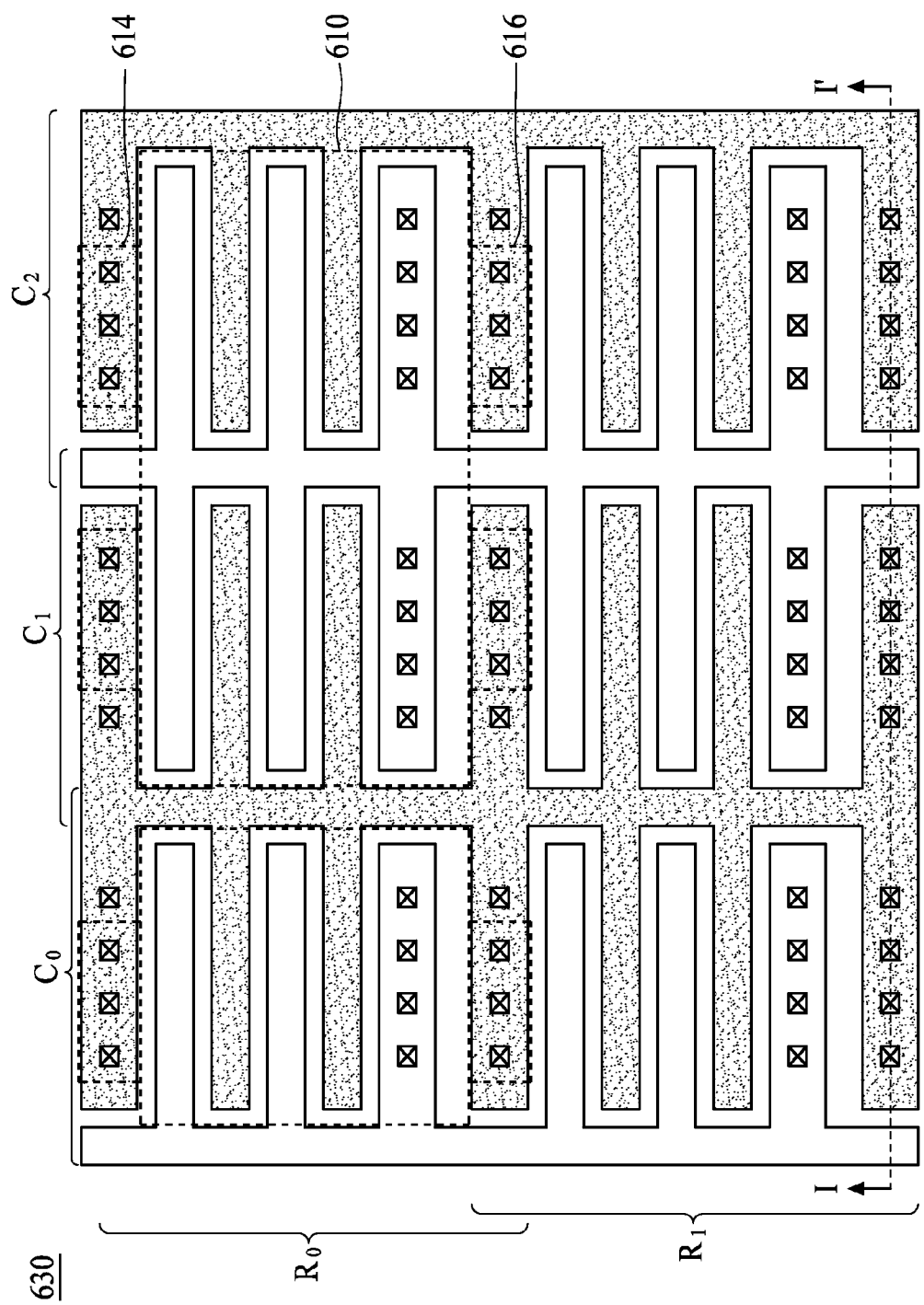
FIG. 6 is a schematic top-view diagram of a metallization layer of a capacitor array in accordance with some embodiments.

FIG. 6 is a schematic top-view diagram 630 of a metallization layer M1 or M3 of a capacitor array, in accordance with some embodiments. In FIG. 6, the capacitor array is a 2×3 matrix. Each of MOM capacitor units at locations ($R_0$, $C_0$), ($R_1$, $C_0$), ($R_0$, $C_2$) and ($R_1$, $C_2$) has the same structures as those shown in the cross-sectional diagram 43, and the top-view diagrams 430 and 432 in FIG. 5. Each of the MOM capacitor units at locations ($R_0$, $C_1$) and ($R_1$, $C_1$) has the same structures as those shown in the cross-sectional diagram 53, and the top-view diagrams 530 and 532 in FIG. 5.

The MOM capacitor units at the column $C_1$ are symmetrical structures of the capacitor units at the column $C_0$ with respect to one of the buses (e.g. 43022 in the top-view diagram 430 in FIG. 5). The MOM capacitor units at the column $C_2$ are symmetrical structures of the capacitor units at the column $C_1$ with respect to one of the buses and therefore reverted back to be the same as the MOM capacitor units at the column $C_0$. In the metallization layer M1, the bus 43022 of the electrode pattern 4302 and the bus (not labeled) of the electrode pattern 5302 indicated in the top-view diagrams 430 and 530 in FIG. 5, are shared between each connected pair of the MOM capacitor units in the columns $C_0$ and $C_1$. Therefore the electrode patterns 4302 and 5302 in the columns $C_0$ and $C_1$ are connected directly without using an extra metallization layer. Similarly, the bus (not labeled) of the electrode pattern 5320 and the bus 43202 of the electrode pattern 4320 indicated in the top-view diagrams 432 and 532 in FIG. 5, are shared between each connected pair of the MOM capacitor units in the columns $C_1$ and $C_2$, and therefore the electrode patterns 5320 and 4320 in the columns $C_1$ and $C_2$ are connected directly without using an extra metallization layer.

In FIG. 6, corresponding locations of varactor units combined with the MOM capacitor units in the row $R_0$ are exemplarily illustrated. For simplicity, the MOM capacitor units in the row $R_1$ are not shown. The varactor unit combined with the MOM capacitor unit at the location ($R_0$, $C_2$) is used as an example below. Other varactor units combined with the MOM capacitor units at other locations have similar overlapping regions. Source or drain regions 614 and 616 of the varactor unit coincide with the wider fingers 43024 and 43028 (indicated in the top-view diagram 430 of FIG. 5) of the MOM capacitor unit. In addition, a gate region 610 of the varactor unit is disposed between the source and drain regions 614 and 616 and overlaps with the bus 43002 of the MOM capacitor unit. The locations of the vias for connecting the varactor unit and the MOM capacitor unit have been described with reference to FIG. 1 and are therefore omitted here.

Figure 7:
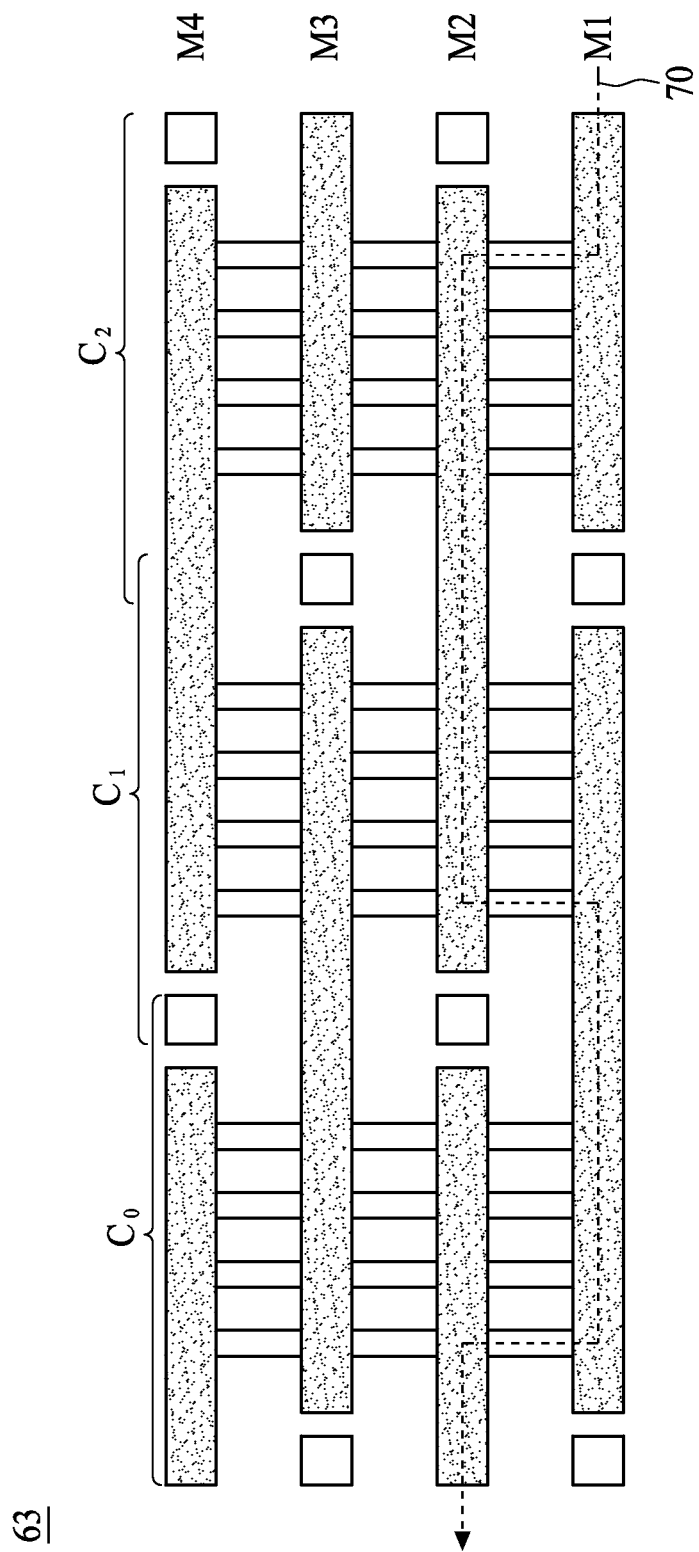
FIG. 7 is a schematic cross-sectional diagram of the capacitor array in FIG. 6 in accordance with some embodiments.

FIG. 7 is a schematic cross-sectional diagram 63 of the capacitor array in FIG. 6 in accordance with some embodiments. The metallization layer M1 or M3 in the cross-sectional diagram 63 is a cross-sectional view along line II' in the top-view diagram 630. The MOM capacitor unit at column $C_0$ has the same cross-sectional diagram as the cross-sectional diagram 43 in FIG. 5. The MOM capacitor unit at column $C_1$ is a symmetrical structure of the capacitor unit at column $C_0$ with respect to one of the buses and has the same cross-sectional diagram as the cross-sectional diagram 53 in FIG. 5. The MOM capacitor unit at column $C_2$ is a symmetrical structure of the capacitor unit at column $C_1$ with respect to one of the buses and has the same cross-sectional diagram as the cross-sectional diagram 43 in FIG. 5. Therefore, the electrode patterns 4302 and 5302 (indicated in FIG. 5) in the corresponding metallization layer M1 or M3 in the columns $C_0$ and $C_1$ are directly coupled using the metallization layer M1 or M3 in the columns $C_0$ and $C_1$. The electrode patterns 4320 and 5320 in the corresponding metallization layer M2 or M4 in the columns $C_0$ and $C_1$ are directly coupled using the metallization layer M2 or M4. The electrode patterns 4320 and 5320 in the corresponding metallization layer M1 or M3 in the columns $C_1$ and $C_2$ are directly coupled using the metallization layer M1 or M3. The electrode patterns 4302 and 5302 in the corresponding metallization layer M2 or M4 in the columns $C_1$ and $C_2$ are directly coupled using the metallization layer M2 or M4. Without using an extra metallization layer for connecting the columns, a signal 70 flowing from the column $C_2$ to the column $C_0$ uses the metallization layer M1 or M2 directly for transmission, thereby reducing the path for signal transmission and improving the IR drop and EM reliability. Furthermore, compared with some other approaches, because the saved metallization layer can be used as another metallization layer for the MOM capacitor units, area efficiency of the capacitor array is enhanced.

Method for Generating a Capacitor Array

Figure 8:
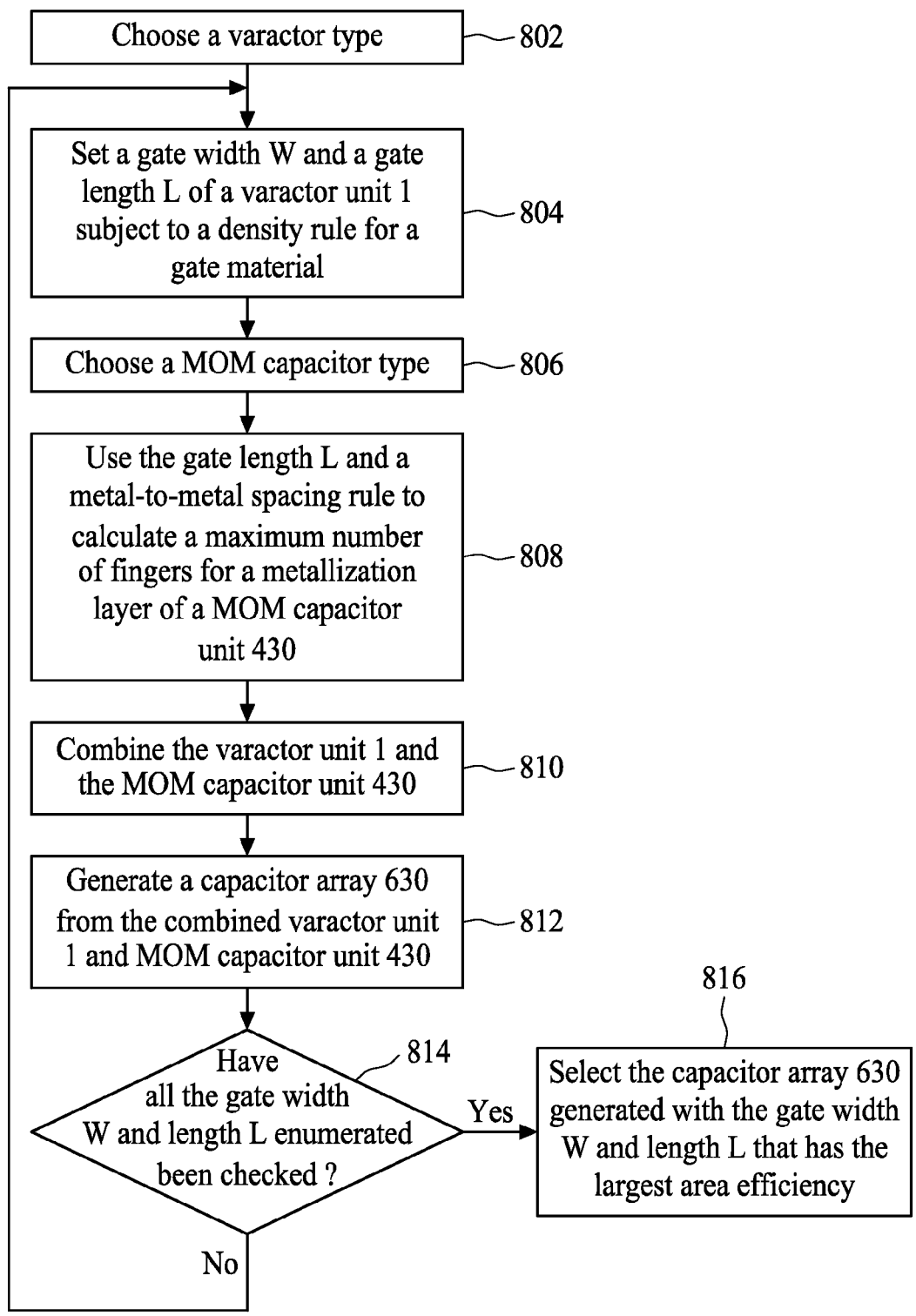
FIG. 8 is a flow chart of a method for generating a capacitor array in FIGS. 6 and 7 in accordance with some embodiments.

FIG. 8 is a flow chart 800 of a method for generating a capacitor array in accordance with some embodiments. The method enumerates different gate sizes of a varactor unit subject to a density rule for a gate material, calculates maximum finger numbers for a MOM capacitor unit for each gate size based on a metal-to-metal spacing rule and selects a capacitor array generated from the combined varactor unit and MOM capacitor unit that has the highest area efficiency.

In operation 802, a varactor type is chosen. Exemplary options include a P-N junction varactor, standard, inversion-mode and accumulation-mode NMOS and/or PMOS varactors. The type of the chosen varactor is based on each application. For purposes of illustration, in the following operations, a MOS capacitor as illustratively shown in FIG. 1 is selected for the varactor type.

In operation 804, a gate width W and a gate length L of the varactor unit 1 as illustratively shown in FIG. 1 are set subject to a density rule for a gate material. In some embodiments, the gate material is polysilicon.

In operation 806, a MOM capacitor type is chosen. For example, the MOM capacitor unit with a structure illustratively shown in FIG. 4, a structure illustratively shown in FIG. 5 or other structure combining the features of FIG. 4 and FIG. 5 can be chosen. For purposes of illustration, the MOM capacitor unit in FIG. 5 is selected. The operation 806 can be performed outside of the loop in FIG. 8.

In operation 808, a maximum number of fingers for a metallization layer of a MOM capacitor unit is calculated using the gate length L and a metal-to-metal spacing rule. In some embodiments, the maximum number of fingers is calculated by subtracting widths of the wider fingers 43006, 43024 and 43028, and the enlarged spacing $d_2$ between the wider fingers 43006 and 43028 from the gate length L of the region 110 in FIG. 1; and calculating the maximum number of thinner fingers 43004 and 43026 with the spacing $d_3$ allowed to be arranged along the remaining gate length L. In some embodiments, the spacing $d_3$ is the minimum metal-to-metal spacing in accordance with the metal-to-metal spacing rule.

In operation 810, the varactor unit 1 in FIG. 1 and the MOM capacitor unit in FIG. 5 are combined. Terminals for contacting the region 110 and the regions 114 and 116, respectively, are adapted into the shapes of electrode patterns 4300 and 4302 in a metallization layer M1 shown in the top-view diagram 430 in FIG. 5, respectively, thereby enabling sharing of the metallization layer M1 between the varactor unit 1 and the MOM capacitor unit. Vias 120 are disposed between the region 110 and a bus 43002, and vias 122 are disposed between the regions 114 and 116 and fingers 43024 and 43028.

In operation 812, a capacitor array is generated from the combined varactor unit 1 and MOM capacitor unit in FIG. 5. As described with reference to FIG. 6, MOM capacitor units (and also the underlying varactor unit) in adjacent columns are symmetrical with respect to each other and therefore are combined directly using the metallization layer of the electrode patterns, saving a metallization layer for increasing area efficiency of the capacitor array.

In operation 814, it is determined whether all the gate widths W and lengths L enumerated have been checked. In some embodiments, the total number of gate widths W and lengths L enumerated is based on the density rule. In other embodiments, the total number of gate widths W and lengths L enumerated is a user-defined number.

If not all the gate widths W and lengths L have been enumerated, then the method 800 loops back to operation 804 to set another gate width W and gate length L for generating a capacitor array.

If all the gate widths W and lengths L have been enumerated, then in operation 816, the capacitor array generated with the gate width W and length L that has the largest area efficiency is selected. The capacitor array with the largest area efficiency is the capacitor array having the highest capacitance per unit area.

In some embodiments, a capacitor device includes a metal-oxide-metal (MOM) capacitor array and a varactor array configured overlapping with the MOM capacitor array. The MOM capacitor array includes a first MOM capacitor unit. The first MOM capacitor unit includes a first electrode pattern and a second electrode pattern in a first metallization layer. The first electrode pattern includes a plurality of first fingers and a first bus interconnecting the plurality of first fingers. The second electrode pattern includes a plurality of second fingers and a second bus interconnecting the plurality of second fingers. The varactor array includes a first varactor unit. The first varactor unit includes a first electrode contacting region and a second electrode contacting region. The first electrode pattern contacts the first electrode contacting region. The second electrode pattern contacts the second electrode contacting region.

In some embodiments, a capacitor device includes a MOM capacitor array. The MOM capacitor array includes a first MOM capacitor unit and a second MOM capacitor unit. The first MOM capacitor unit includes a first electrode pattern and a second electrode pattern in a first metallization layer, and a third electrode pattern and a fourth electrode pattern in a second metallization layer. The first electrode pattern includes a plurality of first fingers and a first bus interconnecting the plurality of first fingers. The second electrode pattern includes a plurality of second fingers and a second bus interconnecting the plurality of second fingers. The third electrode pattern includes a plurality of third fingers and a third bus interconnecting the plurality of third fingers. The fourth electrode pattern comprising a plurality of fourth fingers and a fourth bus interconnecting the plurality of fourth fingers. The third electrode pattern is stacked in a staggered manner with the first electrode pattern. The fourth electrode pattern is stacked in a staggered manner with the second electrode pattern. The second MOM capacitor unit includes a fifth electrode pattern and a sixth electrode pattern in the first metallization layer, and a seventh electrode pattern and an eighth electrode pattern in the second metallization layer. The fifth electrode pattern is symmetrical to the first electrode pattern with respect to the first bus. The sixth electrode pattern is symmetrical to the second electrode pattern with respect to the second bus. The seventh electrode pattern is symmetrical to the third electrode pattern with respect to the third bus. The eighth electrode pattern is symmetrical to the fourth electrode pattern with respect to the fourth bus.

In some embodiments, a capacitor device includes a MOM capacitor array. The MOM capacitor array includes a first MOM capacitor unit. The first MOM capacitor unit includes a first electrode pattern and a second electrode pattern in a first metallization layer, and a third electrode pattern and a fourth electrode pattern in a second metallization layer. The first electrode pattern includes a plurality of first fingers and a first bus interconnecting the plurality of first fingers. The second electrode pattern includes a plurality of second fingers and a second bus interconnecting the plurality of second fingers. The third electrode pattern includes a plurality of third fingers and a third bus interconnecting the plurality of third fingers. The fourth electrode pattern includes a plurality of fourth fingers and a fourth bus interconnecting the plurality of fourth fingers. The third electrode pattern is stacked in a staggered manner with the first electrode pattern. The fourth electrode pattern is stacked in a staggered manner with the second electrode pattern. A first contacting finger in the plurality of first fingers or a second contacting finger in the plurality of second fingers in the first metallization layer contacts a third contacting finger in the plurality of third fingers or a fourth contacting finger in the plurality of fourth fingers in the second metallization layer. At least one first non-contacting finger in the plurality of first fingers or at least one second non-contacting finger in the plurality of second fingers in the first metallization layer does not contact at least one third non-contacting finger in the plurality of third fingers or at least one fourth non-contacting finger in the plurality of fourth fingers in the second metallization layer.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A capacitor device, comprising:
    a metal-oxide-metal (MOM) capacitor array comprising:
        a first MOM capacitor unit comprising:
            a first electrode pattern and a second electrode pattern in a first metallization layer, the first electrode pattern comprising a plurality of first fingers and a first bus interconnecting the plurality of first fingers, and the second electrode pattern comprising a plurality of second fingers and a second bus interconnecting the plurality of second fingers; and
            a third electrode pattern and a fourth electrode pattern in a second metallization layer, the third electrode pattern comprising a plurality of third fingers and a third bus interconnecting the plurality of third fingers and the fourth electrode pattern comprising a plurality of fourth fingers and a fourth bus interconnecting the plurality of fourth fingers,
        wherein
            the third electrode pattern is stacked in a first staggered manner with the first electrode pattern such that at least some of the plurality of first fingers and the plurality of third fingers are partially overlapped, and first non-overlapped portions of the at least some of the plurality of first fingers and the plurality of third fingers extend along opposite sides of first overlapped portions of the at least some of the plurality of first fingers and the plurality of third fingers;
            the third electrode pattern contacts the first electrode pattern;
            the fourth electrode pattern is stacked in a second staggered manner with the second electrode pattern such that at least some of the plurality of second fingers and the plurality of fourth fingers are partially overlapped, and second non-overlapped portions of the at least some of the plurality of second fingers and the plurality of fourth fingers extend along opposite sides of second overlapped portions of the at least some of the plurality of second fingers and the plurality of fourth fingers; and
            the fourth electrode pattern contacts the second electrode pattern.

2. The capacitor device according to claim 1, wherein the MOM capacitor array further comprises:
    a second MOM capacitor unit comprising:
        a fifth electrode pattern and a sixth electrode pattern in the first metallization layer, and a seventh electrode pattern and an eighth electrode pattern in the second metallization layer, the fifth electrode pattern comprising a plurality of fifth fingers and a fifth bus interconnecting the plurality of fifth fingers, the sixth electrode pattern comprising a plurality of sixth fingers and a sixth bus interconnecting the plurality of sixth fingers, the seventh electrode pattern comprising a plurality of seventh fingers and a seventh bus interconnecting the plurality of seventh fingers, the eighth electrode pattern comprising a plurality of eighth fingers and an eighth bus interconnecting the plurality of eighth fingers,
    wherein
        the seventh electrode pattern is stacked in the second staggered manner with the fifth electrode pattern such that at least some of the plurality of fifth fingers and the plurality of seventh fingers are partially overlapped, and third non-overlapped portions of the at least some of the plurality of fifth fingers and the plurality of seventh fingers extend along opposite sides of third overlapped portions of the at least some of the plurality of fifth fingers and the plurality of seventh fingers;
        the eighth electrode pattern is stacked in the first staggered manner with the sixth electrode pattern such that at least some of the plurality of sixth fingers and the plurality of eighth fingers are partially overlapped, and fourth non-overlapped portions of the at least some of the plurality of sixth fingers and the plurality of eighth fingers extend along opposite sides of fourth overlapped portions of the at least some of the plurality of sixth fingers and the plurality of eighth fingers;
        the first overlapped portions under the first staggered manner and the third overlapped portions under the second staggered manner have opposite overlapped sides of the plurality of first fingers and the plurality of third fingers, and overlapped sides of the plurality of the fifth fingers and the plurality of seventh fingers;
        the second overlapped portions under the second staggered manner and the fourth overlapped portions under the first staggered manner have opposite overlapped sides of the plurality of second fingers and the plurality of fourth fingers, and overlapped sides of the plurality of sixth fingers and the plurality of eighth fingers; and the second electrode pattern and the sixth electrode pattern are coupled together, and the third electrode pattern and the seventh electrode pattern are coupled together.

3. The capacitor device according to claim 2, wherein the second electrode pattern and the sixth electrode pattern are coupled together using the first metallization layer, and the third electrode pattern and the seventh electrode pattern are coupled together using the second metallization layer.

4. The capacitor device according to claim 1, wherein a first contacting finger in the plurality of first fingers in the first metallization layer contacts a third contacting finger in the plurality of third fingers in the second metallization layer or a second contacting finger in the plurality of second fingers in the first metallization layer contacts a fourth contacting finger in the plurality of fourth fingers in the second metallization layer;

at least one first non-contacting finger in the plurality of first fingers in the first metallization layer does not contact at least one third non-contacting finger in the plurality of third fingers in the second metallization layer or at least one second non-contacting finger in the plurality of second fingers in the first metallization layer does not contact at least one fourth non-contacting finger in the plurality of fourth fingers in the second metallization layer.

5. The capacitor device according to claim 4, wherein the first contacting finger and the second contacting finger are opposite borders of the plurality of first fingers and the plurality of second fingers, respectively.

6. The capacitor device according to claim 4, wherein the first contacting finger and the second contacting finger are adjacent borders of the plurality of first fingers and the plurality of second fingers, respectively.

7. The capacitor device according to claim 1, wherein the third electrode pattern is symmetrical to the first electrode pattern with respect to the first bus and the fourth electrode pattern is symmetrical to the second electrode pattern with respect to the second bus.

8. A capacitor device, comprising:
a MOM capacitor array comprising:
a first MOM capacitor unit comprising:
a first electrode pattern and a second electrode pattern in a first metallization layer, and a third electrode pattern and a fourth electrode pattern in a second metallization layer, the first electrode pattern comprising a plurality of first fingers and a first bus interconnecting the plurality of first fingers, the second electrode pattern comprising a plurality of second fingers and a second bus interconnecting the plurality of second fingers, the third electrode pattern comprising a plurality of third fingers and a third bus interconnecting the plurality of third fingers and the fourth electrode pattern comprising a plurality of fourth fingers and a fourth bus interconnecting the plurality of fourth fingers,
wherein
the third electrode pattern contacts the first electrode pattern; and
the fourth electrode pattern contacts the second electrode pattern;

a first contacting finger in the plurality of first fingers in the first metallization layer contacts a third contacting finger in the plurality of third fingers in the second metallization layer or a second contacting finger in the plurality of second fingers in the first metallization layer contacts a fourth contacting finger in the plurality of fourth fingers in the second metallization layer; and at least one first non-contacting finger in the plurality of first fingers in the first metallization layer does not contact at least one third non-contacting finger in the plurality of third fingers in the second metallization layer or at least one second non-contacting finger in the plurality of second fingers in the first metallization layer does not contact at least one fourth non-contacting finger in the plurality of fourth fingers in the second metallization layer; and a second MOM capacitor unit comprising:
a fifth electrode pattern and a sixth electrode pattern in the first metallization layer, and a seventh electrode pattern and an eighth electrode pattern in the second metallization layer, the fifth electrode pattern comprising a plurality of fifth fingers and a fifth bus interconnecting the plurality of fifth fingers, the sixth electrode pattern comprising a plurality of sixth fingers and a sixth bus interconnecting the plurality of sixth fingers, the seventh electrode pattern comprising a plurality of seventh fingers and a seventh bus interconnecting the plurality of seventh fingers, the eighth electrode pattern comprising a plurality of eighth fingers and an eighth bus interconnecting the plurality of eighth fingers,
wherein
the seventh electrode pattern contacts the fifth electrode pattern;
the eighth electrode pattern contacts the sixth electrode pattern; and
the second electrode pattern directly contacts the sixth electrode pattern using the first metallization layer, and the third electrode pattern directly contacts the seventh electrode pattern using the second metallization layer.

9. The capacitor device according to claim 8, wherein the first contacting finger and the second contacting finger are opposite borders of the plurality of first fingers and the plurality of second fingers, respectively.

10. The capacitor device according to claim 8, wherein the first contacting finger and the second contacting finger are adjacent borders of the plurality of first fingers and the plurality of second fingers, respectively.

11. A capacitor device, comprising:
a MOM capacitor array comprising:
a first MOM capacitor unit comprising:
a first electrode pattern and a second electrode pattern in a first metallization layer, and a third electrode pattern and a fourth electrode pattern in a second metallization layer, the first electrode pattern comprising a plurality of first fingers and a first bus interconnecting the plurality of first fingers, the second electrode pattern comprising a plurality of second fingers and a second bus interconnecting the plurality of second fingers, the third electrode pattern comprising a plurality of third fingers and a third bus interconnecting the plurality of third fingers and the fourth electrode pattern comprising a plurality of fourth fingers and a fourth bus interconnecting the plurality of fourth fingers, wherein a first contacting finger in the plurality of first fingers in the first metallization layer contacts a third contacting finger in the plurality of third fingers in the second metallization layer or a second contacting finger in the plurality of second fingers in the first metallization layer contacts a fourth contacting finger in the plurality of fourth fingers in the second metallization layer; and at least one first non-contacting finger in the plurality of first fingers in the first metallization layer does not contact at least one third non-contacting finger in the plurality of third fingers in the second metallization layer or at least one second non-contacting finger in the plurality of second fingers in the first metallization layer does not contact at least one fourth non-contacting finger in the plurality of fourth fingers in the second metallization layer.

12. The capacitor device according to claim 11, wherein the third electrode pattern is stacked in a first staggered manner with the first electrode pattern such that at least some of the plurality of first fingers and the plurality of third fingers are partially overlapped, and first non-overlapped portions of the at least some of the plurality of first fingers and the plurality of third fingers extend along opposite sides of first overlapped portions of the at least some of the plurality of first fingers and the plurality of third fingers; and the fourth electrode pattern is stacked in a second staggered manner with the second electrode pattern such that at least some of the plurality of second fingers and the plurality of fourth fingers are partially overlapped, and second non-overlapped portions of the at least some of the plurality of second fingers and the plurality of fourth fingers extend along opposite sides of second overlapped portions of the at least some of the plurality of second fingers and the plurality of fourth fingers.

13. The capacitor device according to claim 11, wherein the first contacting finger and the second contacting finger are opposite borders of the plurality of first fingers and the plurality of second fingers, respectively.

14. The capacitor device according to claim 11, wherein the first contacting finger and the second contacting finger are adjacent borders of the plurality of first fingers and the plurality of second fingers, respectively.

15. The capacitor device according to claim 8, wherein the second bus and the sixth bus are shared; and the third bus and the seventh bus are shared.

16. The capacitor device according to claim 8, wherein the fifth electrode pattern is symmetrical to the first electrode pattern with respect to the first bus, the sixth electrode pattern is symmetrical to the second electrode pattern with respect to the second bus, the seventh electrode pattern is symmetrical to the third electrode pattern with respect to the third bus and the eighth electrode pattern is symmetrical to the fourth electrode pattern with respect to the fourth bus.

\* \* \* \* \*